(12) United States Patent
Kim

(10) Patent No.: US 12,455,479 B2
(45) Date of Patent: Oct. 28, 2025

(54) DISPLAY PANEL AND DISPLAY DEVICE WITH UNEVEN PADS HAVING ISLAND-LIKE STRUCTURES

(71) Applicant: Samsung Display Co., Ltd., Yongin-si (KR)

(72) Inventor: Byoungyong Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 293 days.

(21) Appl. No.: 17/700,870

(22) Filed: Mar. 22, 2022

(65) Prior Publication Data

US 2022/0392869 A1 Dec. 8, 2022

(30) Foreign Application Priority Data

Jun. 3, 2021 (KR) .......................... 10-2021-0072263

(51) Int. Cl.
*G02F 1/1345* (2006.01)
*H01L 23/00* (2006.01)
(Continued)

(52) U.S. Cl.
CPC .... *G02F 1/13458* (2013.01); *H01L 23/49838* (2013.01); *H01L 24/02* (2013.01);
(Continued)

(58) Field of Classification Search
CPC ......... H01L 24/81; H01L 24/02; H01L 24/03; H01L 24/04; H01L 24/05; H01L 24/06; H01L 24/13; H01L 24/16; H01L 23/49838; H01L 2224/02145; H01L 2224/0215; H01L 2224/03011; H01L 2224/0361; H01L 2224/0401; H01L 2224/05018; H01L 2224/05082; H01L 2224/05124; H01L 2224/05166; H01L 2224/0518; H01L 2224/05558; H01L 2224/05562; H01L 2224/05573; H01L 2224/05624; H01L 2224/05666; H01L 2224/0568; H01L 2224/0603; H01L 2224/06135; H01L 2224/13111; H01L 2224/13144; H01L 2224/13155; H01L 2224/16014; H01L 2224/16148; H01L 2224/16238;
(Continued)

(56) References Cited

U.S. PATENT DOCUMENTS 10,302,403 B2   5/2019   Burrow
10,302,404 B2   5/2019   Burrow
(Continued)

FOREIGN PATENT DOCUMENTS

KR   1020190130091 A   11/2019
KR   1020200024378 A   3/2020

*Primary Examiner* — Wael M Fahmy
*Assistant Examiner* — Tiberiu Dan Onuta
(74) *Attorney, Agent, or Firm* — CANTOR COLBURN LLP

(57) ABSTRACT

A display panel includes a substrate including a display area and a pad area spaced apart from the display area, and an uneven pad disposed on the substrate in the pad area. The uneven pad includes a first conductive layer, a first organic layer disposed on the first conductive layer and having an upper surface having an uneven shape, and a second conductive layer disposed on the first organic layer.

19 Claims, 11 Drawing Sheets

(51) Int. Cl.
*H01L 23/498* (2006.01)
*H10K 50/88* (2023.01)
*H10K 59/131* (2023.01)
*H10K 59/179* (2023.01)

(52) U.S. Cl.
CPC .............. *H01L 24/03* (2013.01); *H01L 24/04* (2013.01); *H01L 24/05* (2013.01); *H01L 24/06* (2013.01); *H01L 24/81* (2013.01); *H10K 50/88* (2023.02); *H10K 59/131* (2023.02); *H10K 59/179* (2023.02); *G02F 1/13452* (2013.01); *H01L 24/13* (2013.01); *H01L 24/16* (2013.01); *H01L 2224/02145* (2013.01); *H01L 2224/0215* (2013.01); *H01L 2224/03011* (2013.01); *H01L 2224/0361* (2013.01); *H01L 2224/0401* (2013.01); *H01L 2224/05018* (2013.01); *H01L 2224/05082* (2013.01); *H01L 2224/05124* (2013.01); *H01L 2224/05166* (2013.01); *H01L 2224/0518* (2013.01); *H01L 2224/05558* (2013.01); *H01L 2224/05562* (2013.01); *H01L 2224/05573* (2013.01); *H01L 2224/05624* (2013.01); *H01L 2224/05666* (2013.01); *H01L 2224/0568* (2013.01); *H01L 2224/0603* (2013.01); *H01L 2224/06135* (2013.01); *H01L 2224/13111* (2013.01); *H01L 2224/13144* (2013.01); *H01L 2224/13155* (2013.01); *H01L 2224/16014* (2013.01); *H01L 2224/16148* (2013.01); *H01L 2224/16238* (2013.01); *H01L 2224/81007* (2013.01); *H01L 2224/81205* (2013.01); *H01L 2224/81385* (2013.01); *H01L 2224/81424* (2013.01); *H01L 2224/81466* (2013.01); *H01L 2224/8148* (2013.01); *H01L 2924/0635* (2013.01); *H01L 2924/07025* (2013.01)

(58) Field of Classification Search
CPC . H01L 2224/81007; H01L 2224/81205; H01L 2224/81385; H01L 2224/81424; H01L 2224/81466; H01L 2224/8148; H01L 2224/05554; H01L 2224/05557; H01L 2224/81206; H01L 2224/81365; H01L 2224/05017; H01L 2224/05553; H01L 2224/75343; H01L 2924/0635; H01L 2924/07025; H01L 24/742; H01L 21/607; G02F 1/13452; G02F 1/13458; G02F 1/1362; G02F 1/1343; G02F 1/133305; H10K 50/88; H10K 59/131; H10K 59/179
See application file for complete search history.

(56) References Cited

U.S. PATENT DOCUMENTS

| | | | |
|---|---|---|---|
| 10,330,451 | B2 | 6/2019 | Burrow |
| 10,355,436 | B2 | 7/2019 | Van Swearingen |
| 10,886,348 | B2 | 1/2021 | Kim et al. |
| 11,552,155 | B2 * | 1/2023 | Park .................. H10K 59/40 |
| 2019/0348382 | A1 * | 11/2019 | Bodea .................. H10D 64/01 |
| 2019/0348487 | A1 * | 11/2019 | Kim .................. H10K 59/131 |
| 2020/0286977 | A1 * | 9/2020 | Roh .................. G09G 3/20 |

* cited by examiner

DISPLAY PANEL AND DISPLAY DEVICE WITH UNEVEN PADS HAVING ISLAND-LIKE STRUCTURES

This application claims priority to Korean Patent Application No. 10-2021-0072263, filed on Jun. 3, 2021, and all the benefits accruing therefrom under 35 U.S.C. § 119, the content of which in its entirety is herein incorporated by reference.

BACKGROUND

1. Field

The disclosure relates generally to a display panel, a display device including the display panel, and a method of manufacturing the display device.

2. Discussion of the Related Art

A cathode ray tube ("CRT") television, which is one of display devices, was widely used due to desired characteristics in terms of performance and price. The CRT television has undesired characteristics in terms of miniaturization or portability. As technology improves, display devices having smaller sizes, lighter weight, and superior performance have been produced. For example, a plasma display device, a liquid crystal display device, an organic light emitting display device, and a quantum dot display device having desired characteristics such as miniaturization, light weight, and low power consumption are widely used.

A display device typically includes a display panel, a driving chip, a flexible substrate, and a main substrate (e.g. printed circuit board). The driving chip may be bonded to the display panel, and the flexible substrate may be bonded to both the display panel and the main substrate.

In such a display device, for example, when bonding the display panel and the driving chip, an anisotropic conductive film disposed between a pad included in the display panel and a bump included in the driving chip has been used. The anisotropic conductive film may electrically connect and fix the pad and the bump.

Recently, ultrasonic bonding may be used to electrically connect and fix the pad and the bump.

SUMMARY

Some embodiments of the disclosure provide a display panel having improved process reliability.

Some embodiments of the disclosure provide a display device including the display panel.

Some embodiments of the disclosure provide a method of manufacturing the display device.

According to an embodiment, a display panel may include a substrate including a display area and a pad area spaced apart from the display area, and an uneven pad disposed on the substrate in the pad area, where the uneven pad includes a first conductive layer, a first organic layer disposed on the first conductive layer and having an upper surface having an uneven shape, and a second conductive layer disposed on the first organic layer.

According to an embodiment, the second conductive layer may cover the first organic layer.

According to an embodiment, the second conductive layer may have an upper surface having an uneven shape corresponding to the uneven shape of the upper surface of the first organic layer.

According to an embodiment, the uneven pad may include a stepped area in which the first organic layer is disposed and a connection area surrounding the stepped area. The first conductive layer may be spaced apart from the second conductive layer in the stepped area.

According to an embodiment, the first conductive layer may contact the second conductive layer in the connection area.

According to an embodiment, the first organic layer may be disposed on an upper surface of the first conductive layer and the first organic layer may be not disposed on a side surface of the first conductive layer.

According to an embodiment, the uneven pad may further include a third conductive layer. In such an embodiment, the third conductive layer may be disposed between the substrate and the first conductive layer and may contact the first conductive layer.

According to an embodiment, the uneven pad may further include a second organic layer. In such an embodiment, the second organic layer may be disposed on the first conductive layer, may have an upper surface having an uneven shape, and may be spaced apart from the first organic layer in a first direction.

According to an embodiment, the uneven pad may further include a third organic layer. In such an embodiment, the third organic layer may be disposed on the first conductive layer, may have an upper surface having an uneven shape, and may be spaced apart from the first organic layer in a second direction intersecting the first direction.

According to an embodiment, the display panel may further include a plurality of first pads disposed on a central portion of the pad area and a plurality of second pads disposed on a side portion of the pad area. In such an embodiment, the first pads and the second pads may be disposed on the substrate in the pad area and may be arranged in a matrix form.

According to an embodiment, each of the first pads may include the uneven pad.

According to an embodiment, each of the second pads may include the uneven pad.

According to an embodiment, a thickness of a first organic layer of each of the first pads may be greater than a thickness of a first organic layer of each of the second pads.

According to an embodiment, the uneven pad may include at least one selected from titanium, aluminum, and molybdenum.

According to an embodiment, a display device may include a substrate including display area, a first pad area spaced apart from the display area, and a second pad area spaced apart from the first pad area, a display panel disposed on the substrate in the first pad area, where the display panel includes a first uneven pad including a first conductive layer, an organic layer disposed on the first conductive layer and having an upper surface having an uneven shape, and a second conductive layer disposed on the organic layer, and a driving chip including a first bump electrically connected to the first uneven pad.

According to an embodiment, the display panel may further include a second uneven pad disposed on the substrate in the second pad area and including a first conductive layer, an organic layer disposed on the first conductive layer and having an upper surface having an uneven shape, and a second conductive layer disposed on the organic layer. In such an embodiment, the display device may further comprise a flexible substrate including a second bump electrically connected to the second uneven pad.

According to an embodiment, the flexible substrate may further include a third bump spaced apart from the second bump. In such an embodiment, the display device may further includes a main substrate including a third uneven pad electrically connected to the third bump.

According to an embodiment, the third uneven pad may include a first conductive layer, an organic layer disposed on the first conductive layer and having an upper surface having an uneven shape, and a second conductive layer disposed on the organic layer.

According to an embodiment, the first to third bumps may include at least one selected from gold, nickel, and tin.

According to an embodiment, a method of manufacturing a display device may include providing a first conductive layer on a substrate in a pad area, providing an organic layer on the first conductive layer, dry etching an upper surface of the organic layer in a way such that the upper surface of the organic layer has an uneven shape, providing a second conductive layer on the organic layer, and bonding a bump to the second conductive layer using an ultrasonic bonding.

In embodiments of the invention, since the uneven pad includes the organic layer having a predetermined thickness, the uneven pad may have a step difference. In such embodiments, a pressure transmitted to the uneven pad may increase in an ultrasonic bonding process.

In embodiments of the invention, since the upper surface of the uneven pad has an uneven shape, a friction coefficient of the uneven pad may increase. In such embodiments, a material of the uneven pad and a material of the bump corresponding to the uneven pad may easily diffuse to each other by a vibration applied in the ultrasonic bonding process such that the reliability of the ultrasonic bonding process may be improved.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
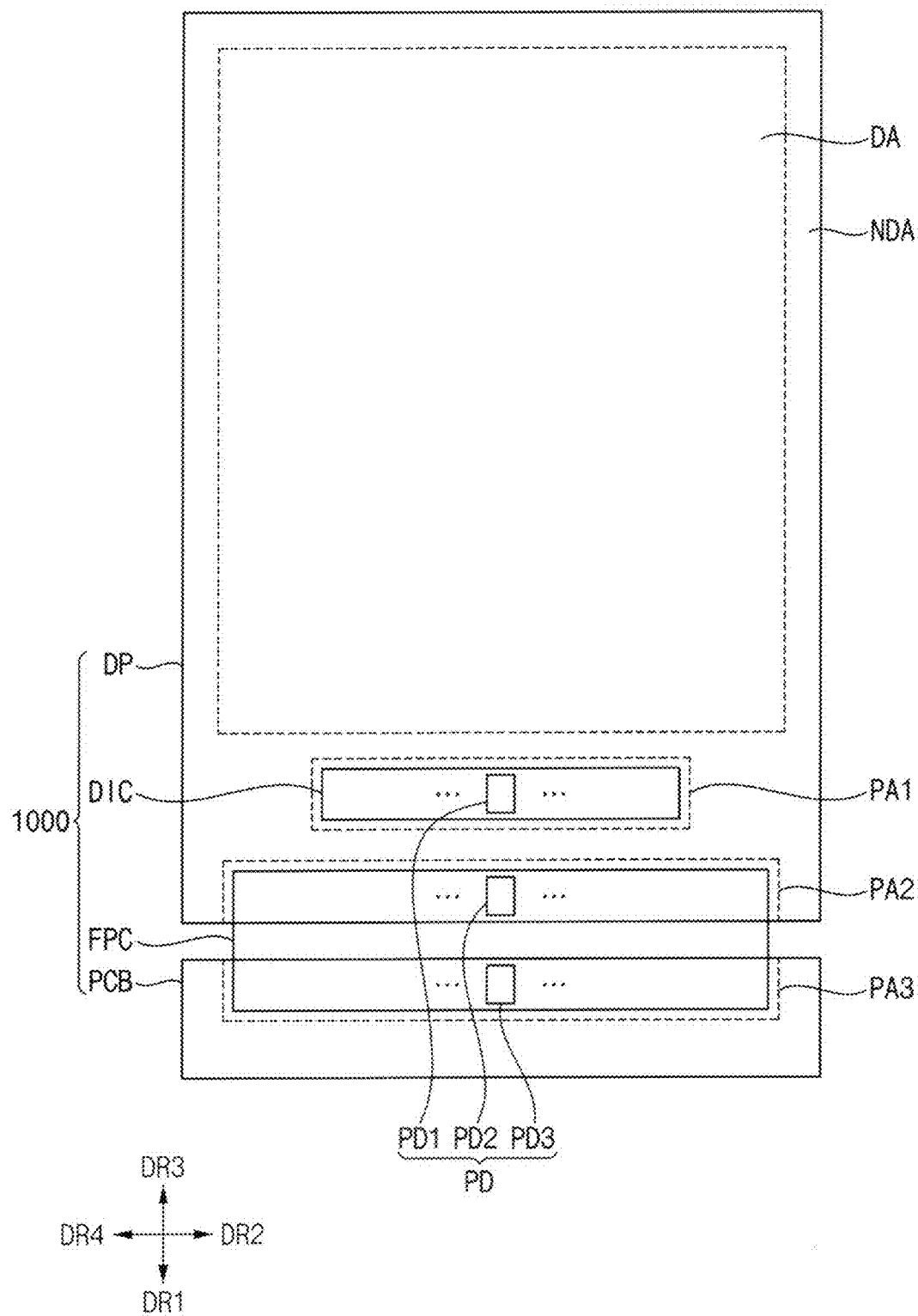
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
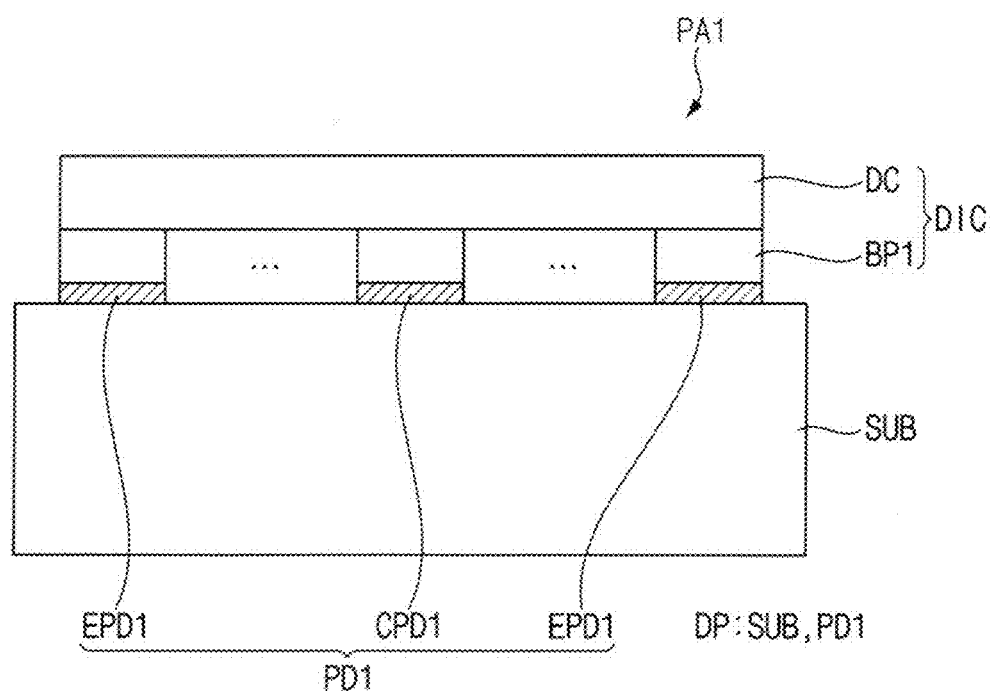
FIG. 2 is a side view illustrating a display panel and a driving chip included in the display device of FIG. 1.
Figure 3:
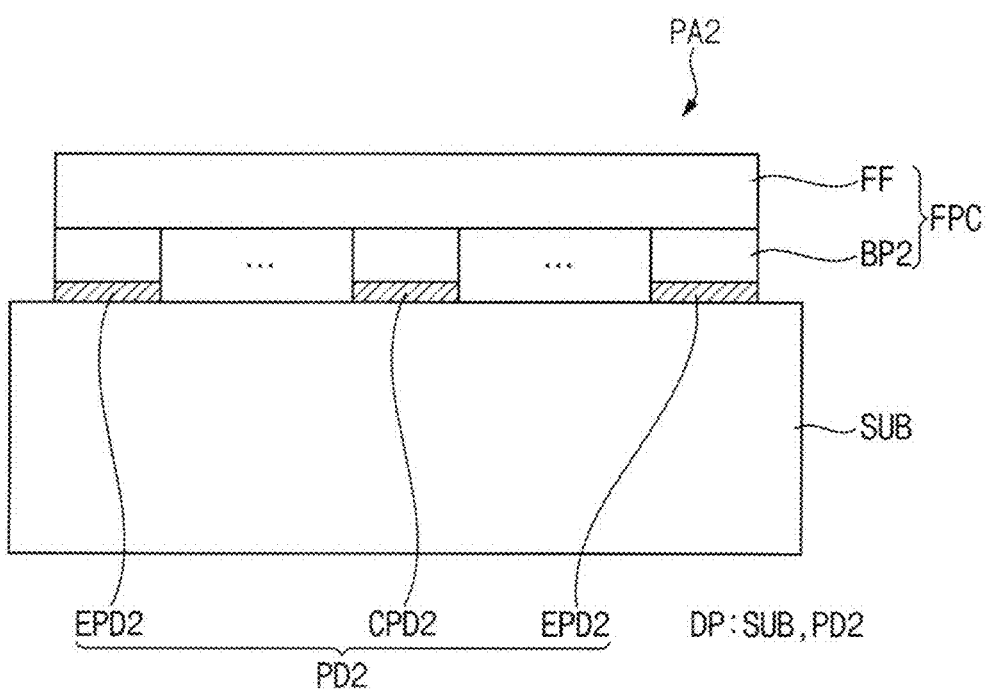
FIG. 3 is a side view illustrating a display panel and a flexible substrate included in the display device of FIG. 1.
Figure 4:
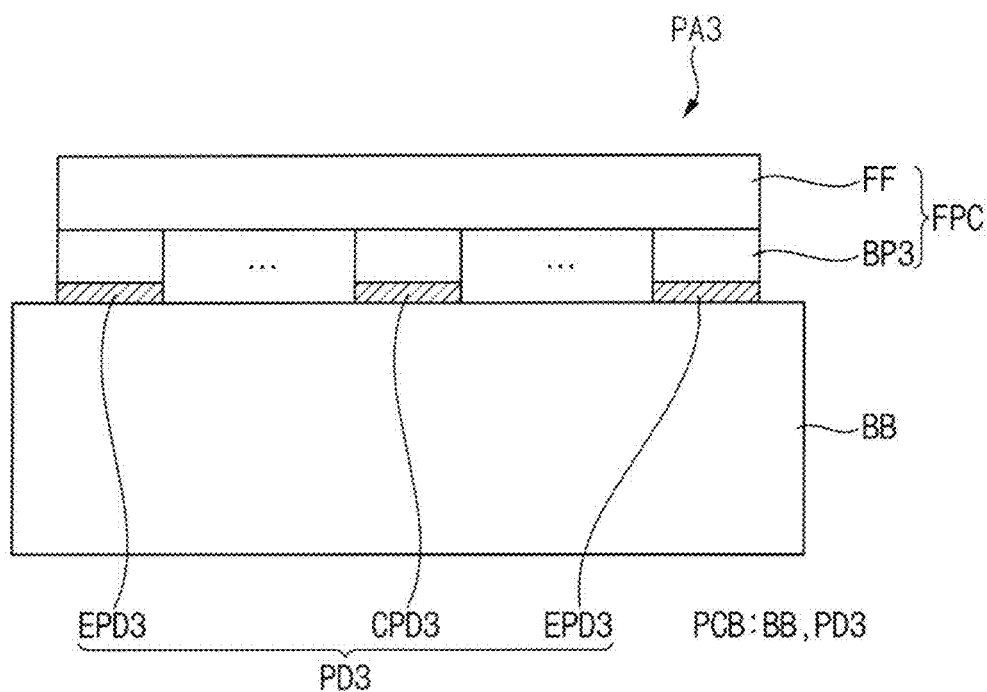
FIG. 4 is a side view illustrating a flexible substrate and a main substrate included in the display device of FIG. 1.

FIG. 1 is a plan view illustrating a display device according to an embodiment. FIG. 2 is a side view illustrating a display panel and a driving chip included in the display device of FIG. 1. FIG. 3 is a side view illustrating a display panel and a flexible substrate included in the display device of FIG. 1. FIG. 4 is a side view illustrating a flexible substrate and a main substrate included in the display device of FIG. 1.

Referring to FIGS. 1 to 4, an embodiment of a display device 1000 may include a display panel DP, a driving chip DIC, a flexible substrate FPC, and a main substrate PCB.

In an embodiment, the display panel DP may be a plasma display panel, a liquid crystal display panel, an organic light emitting display panel, a quantum dot display panel, or the like.

The display panel DP may include a substrate SUB, a plurality of first pads PD1, and a plurality of second pads PD2. The substrate SUB may include a display area DA and a non-display area NDA. The non-display area NDA may include a first pad area PA1 and a second pad area PA2. The first pads PD1 may be disposed on the substrate SUB. The first pads PD1 may include a plurality of center pads CPD1 disposed on a central portion of the first pad area PA1 and a plurality of edge pads EPD1 disposed on a side portion of the first pad area PA1. The second pads PD2 may be disposed on the substrate SUB. The second pads PD2 may include a plurality of center pads CPD2 disposed on a central portion of the second pad area PA2 and a plurality of edge pads EPD2 disposed on a side portion of the second pad area PA2.

A plurality of pixels may be disposed in the display area DA. Each of the pixels may emit light. The display area DA may display an image.

The first pad area PA1 may be spaced apart from the display area DA. The first pad area PA1 may be spaced apart from the display area DA in a first direction DR1 or the display area DA may be spaced apart from the first pad area PA1 in a third direction DR3 opposite to the first direction DR1. The first pads PD1 may be disposed in the first pad area PA1. The first pads PD1 may be disposed on the substrate SUB in the first pad area PA1.

The second pad area PA2 may be spaced apart from the display area DA and the first pad area PA1. The second pad area PA2 may be spaced apart from the first pad area PA1 in the first direction DR1. The second pads PD2 may be disposed in the second pad area PA2. The second pads PD2 may be disposed on the substrate SUB in the second pad area PA2.

The non-display area NDA may surround the display area DA.

The driving chip DIC may be disposed on the display panel DP. The driving chip DIC may be disposed in the first pad area PA1. The driving chip DIC may overlap the first pads PD1. The driving chip DIC may provide a driving signal to the display panel DP. In one embodiment, for example, the driving chip DIC may provide a data signal to the display panel DP.

The driving chip DIC may include a driving integrated circuit DC and a first bump BP1. The driving integrated circuit DC may provide the driving signal to the display panel DP. In an embodiment, as shown in FIG. 2, the first bump BP1 may be disposed under the driving integrated circuit DC. The first bump BP1 may be provided in plural. In one embodiment, for example, the number of the first bumps BP1 may correspond to the number of first pads PD1.

The flexible substrate FPC may be disposed on the display panel DP. The flexible substrate FPC may be disposed in the second pad area PA2. A portion of the flexible substrate FPC may overlap the second pads PD2. Another portion of the flexible substrate FPC may not overlap the display panel DP.

In an embodiment, as shown in FIG. 3, the flexible substrate FPC may include a flexible film FF and a second bump BP2. The flexible film FF may include a polymer resin. The flexible film FF may have characteristics such as bendable, foldable, and flexible. The flexible film FF may be bent toward a rear surface of the display device 1000 not to be viewed on a plane of the display device 1000. The second bump BP2 may be disposed under the flexible film FF. The second bump BP2 may be provided in plural. In one embodiment, for example, the number of the second bumps BP2 may correspond to the number of the second pads PD2.

The main substrate PCB may be spaced apart from the display panel DP. The main substrate PCB may include a third pad area PA3. The main substrate PCB may overlap the flexible substrate FPC in the third pad area PA3. A portion of the flexible substrate FPC may overlap the second pad area PA2 of the display panel DP. Another portion of the flexible substrate FPC may overlap the third pad area PA3 of the main substrate PCB.

The main substrate PCB may include a base substrate BB and a plurality of third pads PD3. The third pads PD3 may be disposed in the third pad area PA3. The third pads PD3 may be disposed on the base substrate BB in the third pad area PA3. The third pads PD3 may include a plurality of center pads CPD3 disposed on a central portion of the third pad area PA3 and a plurality of edge pads EPD3 disposed on a side portion of the third pad area PA3.

The flexible substrate FPC may further include a third bump BP3. The third bump BP3 may be spaced apart from the second bump BP2. The second bump BP2 may be disposed on the second pad area PA2, and the third bump BP3 may be disposed on the third pad area PA3. The third bump BP3 may be provided in plural. In one embodiment, for example, the number of the third bumps BP3 may correspond to the number of the third pads PD3.

The base substrate BB may provide a driving signal to the display panel DP. In one embodiment, for example, the base substrate BB may provide a gate signal to the display panel DP. The base substrate BB may provide the gate signal to the display panel DP through the flexible substrate FPC.

The first to third pads PD1, PD2, and PD3 may include a conductive material. In one embodiment, for example, the first to third pads PD1, PD2, and PD3 may include a metal. In such an embodiment, the metal includes titanium, aluminum, and molybdenum, for example. These may be used alone or in combination with each other. However, the material included in the first to third pads PD1, PD2, and PD3 is not limited thereto, and the first to third pads PD1, PD2, and PD3 may include at least one selected from other various conductive materials.

The first to third bumps BP1, BP2, and BP3 may include a conductive material. In one embodiment, for example, the first to third bumps BP1, BP2, and BP3 may include a metal. In such an embodiment, the metal includes gold, nickel, and tin, for example. These may be used alone or in combination with each other. However, the material included in the first to third bumps BP1, BP2, and BP3 is not limited thereto, and the first to third bumps BP1, BP2, and BP3 may include at least one selected from other various conductive materials.

In the first pad area PA1, the first pads PD1 of the display panel DP and the first bump BP1 of the driving chip DIC may be bonded to each other. As the first pads PD1 and the first bump BP1 are bonded to each other, the first pads PD1 and the first bump BP1 may be electrically connected to each other. The driving integrated circuit DC may provide the driving signal to the display panel DP through the first bump BP1 and the first pads PD1. The driving chip DIC may provide the data signal to the display area DA of the display panel DP through the first bump BP1 and the first pads PD1.

In the second pad area PA2, the second pads PD2 of the display panel DP and the second bump BP2 of the flexible substrate FPC may be bonded to each other. As the second pads PD2 and the second bump BP2 are bonded to each other, the second pads PD2 and the second bump BP2 may be electrically connected to each other. In the third pad area PA3, the third pads PD3 of the main substrate PCB and the third bump BP3 of the flexible substrate FPC may be bonded to each other. As the third pads PD3 and the third bump BP3 are bonded to each other, the third pads PD3 and the third bump BP3 may be electrically connected to each other. The base substrate BB may provide the driving signal to the flexible substrate FPC through the third pads PD3 and the third bump BP3. The flexible substrate FPC may transmit the driving signal to the display panel DP through the second bump BP2 and the second pads PD2. The main substrate PCB may provide the gate signal to the display area DA of the display panel DP through the flexible substrate FPC.

In embodiments, a bonding process of the first pads PD1 and the first bump BP1 may be the same as a bonding process of the second pads PD2 and the second bump BP2 and a bonding process of the third pads PD3 and the third bump BP3. Hereinafter, an embodiment of the bonding process of the first pads PD1 and the first bump BP1 will be described in detail, and any repetitive detailed description of the bonding process of the second pads PD2 and the second bump BP2 and the bonding process of the third pads PD3 and the third bump BP3 will be omitted or simplified. In an embodiment, the bonding process includes a thermocompression bonding process and an ultrasonic bonding process.

In an embodiment of the bonding process of the first pads PD1 and the first bump BP1 using the thermocompression process, an anisotropic conductive film may be disposed between the first pads PD1 and the first bump BP1. The thermocompression process may be a process of bonding the first pads PD1 and the first bump BP1 by applying heat and pressure to the first pads PD1, the anisotropic conductive film, and the first bump BP1. The anisotropic conductive film may include a resin and a conductive ball. The resin may fix the first pads PD1 and the first bump BP1. The conductive ball may electrically connect the first pads PD1 and the first bump BP1. The heat may be applied to the first pads PD1, the anisotropic conductive film, and the first bump BP1 using a hot bar or a laser.

In an embodiment of the bonding process of the first pads PD1 and the first bump BP1 using the ultrasonic bonding process, the first pads PD1 and the first bump BP1 may contact each other. The ultrasonic bonding process may be a process of bonding the first pads PD1 and the first bump BP1 by applying pressure and vibration by ultrasonic waves to the first pads PD1 and the first bump BP1. The pressure used for the ultrasonic bonding process may be greater than the pressure used for the thermocompression process. Due to pressure and vibration by ultrasonic waves, a material of the first pads PD1 may diffuse toward the first bump BP1, and a material of the first bump BP1 may diffuse toward the first pads PD1. In one embodiment, for example, at a boundary between the first pads PD1 and the first bump BP1, a material, e.g., titanium, of the first pads PD1 and a material, e.g., gold, of the first bump BP1 diffuse to each other, so that the first pads PD1 and the first bump BP1 may be electrically connected.

In such an embodiment using the ultrasonic bonding process, it is desired to increase the pressure applied to the first pads PD1 through the first bump BP1 to improve the reliability of the ultrasonic bonding process. In such an embodiment using the ultrasonic bonding process, it is desired to increase a friction coefficient of the first pads PD1 and the first bump BP1 so that the material of the first pads PD1 and the material of the first bump BP1 are easily diffused.

Figure 5:
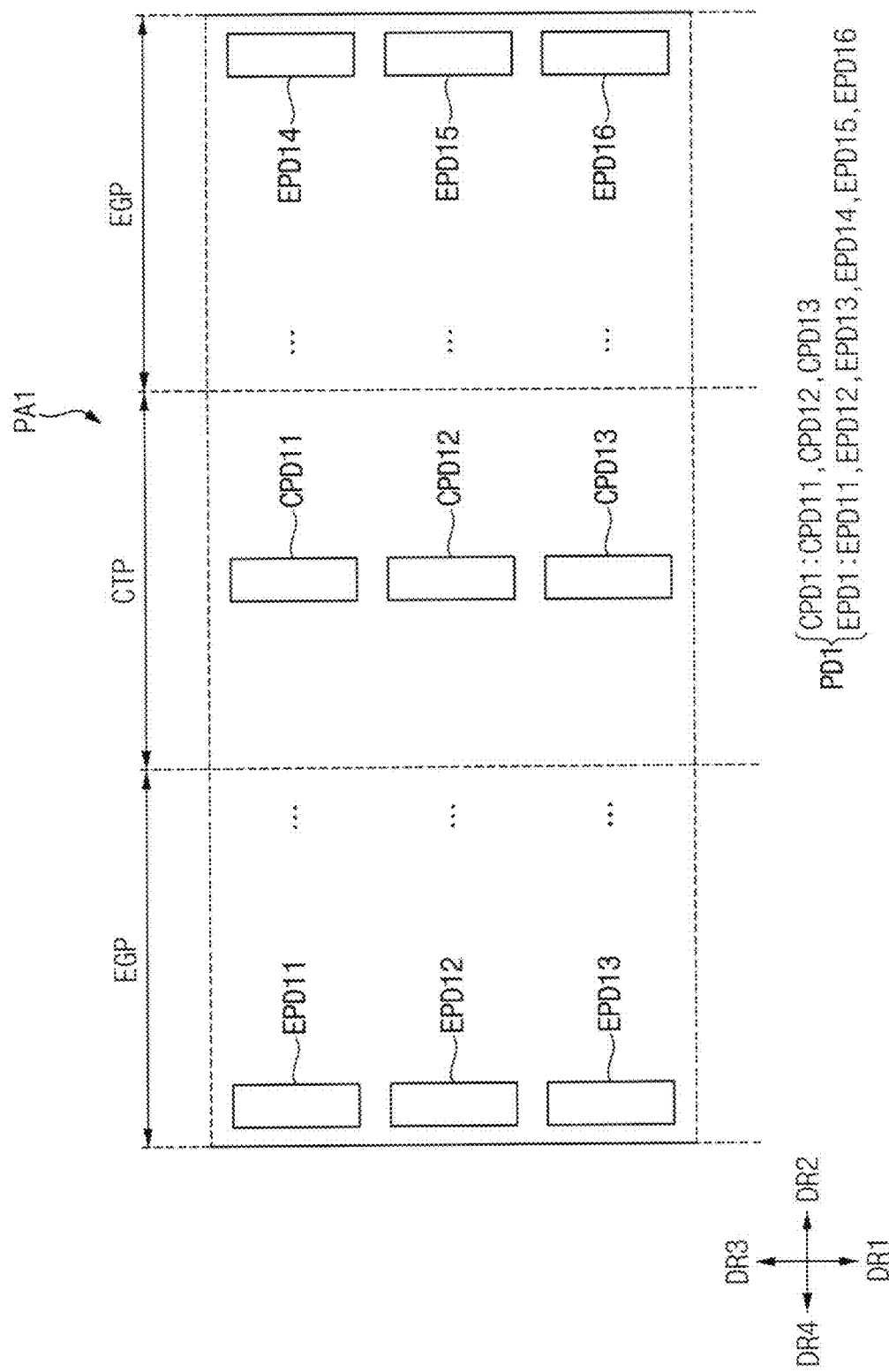
FIG. 5 is an enlarged view illustrating a first pad area of a display panel included in the display device of FIG. 1.

FIG. 5 is an enlarged view illustrating a first pad area of a display panel included in the display device of FIG. 1.

Referring to FIG. 5, the first pad area PA1 may be divided into a central portion CTP and a side portion EGP. The display panel DP may include a plurality of center pads CPD1 disposed on the central portion CTP of the first pad area PA1 and a plurality of edge pads EPD1 disposed on the side portion EGP of the first pad area PA1. The first pads PD1 of the display panel DP may include the center pads CPD1 and the edge pads EPD1. The first pads PD1 may be arranged in a matrix form. In one embodiment, for example, the first pads PD1 may be arranged in the matrix form including three rows and several tens of columns.

In one embodiment, for example, the center pads CPD1 may include first to third center pads CPD11, CPD12, and CPD13 arranged in one column and three rows. The first to third center pads CPD11, CPD12, and CPD13 may be sequentially arranged in the first direction DR1.

In one embodiment, for example, the edge pads EPD1 may include first to sixth edge pads EPD11, EPD12, EPD13, EPD14, EPD15, and EPD16 arranged in two columns and three rows.

The pressure of the bonding process may be differently transmitted to the center pads CPD1 and the edge pads EPD1. In one embodiment, for example, the pressure transmitted to the center pads CPD1 may be less than the pressure transmitted to the edge pads EPD1. Accordingly, the pressure transmitted to the center pads CPD1 is desired to be adjusted to be the same as the pressure transmitted to the edge pads EPD1.

Figure 6:
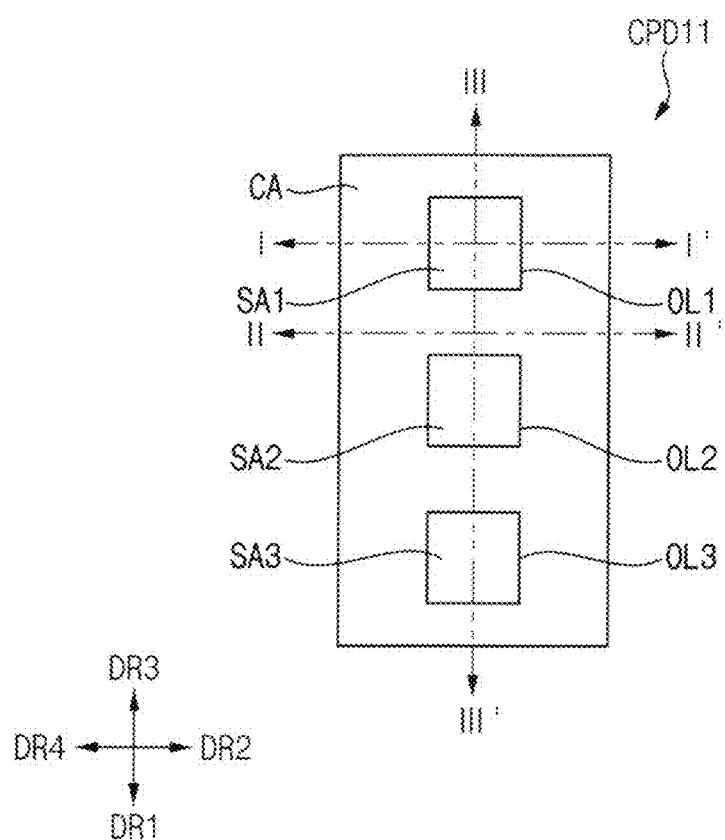
FIG. 6 is an enlarged view illustrating one pad disposed in a central portion of the display panel of FIG. 5.

FIG. 6 is an enlarged view illustrating one pad disposed in a central portion of the display panel of FIG. 5. Particularly, FIG. 6 may be an enlarged view illustrating a first center pad CPD11 of FIG. 5.

Referring to FIG. 6, in an embodiment, the first center pad CPD11 may include a first organic layer OL1. The first center pad CPD11 may include a first stepped (or protruded) area SA1 in which the first organic layer OL1 is disposed and a connection area CA surrounding the first stepped area SA1.

The first center pad CPD11 may further include a second organic layer OL2 spaced apart from the first organic layer OL1 in the first direction DR1 and a third organic layer OL3 spaced apart from the second organic layer OL2 in the first direction DR1. The first center pad CPD11 may further include a second stepped area SA2 in which the second organic layer OL2 is disposed and a third stepped area SA3 in which the third organic layer OL3 is disposed. The first center pad CPD11 may include the first stepped area SA1, the second stepped area SA2 spaced apart from the first stepped area SA1 in the first direction DR1, the third stepped area SA3 spaced apart from the second stepped area SA2 in the first direction DR1, and a connection area CA surrounding the first to third stepped areas SA1, SA2, and SA3.

Figure 7:
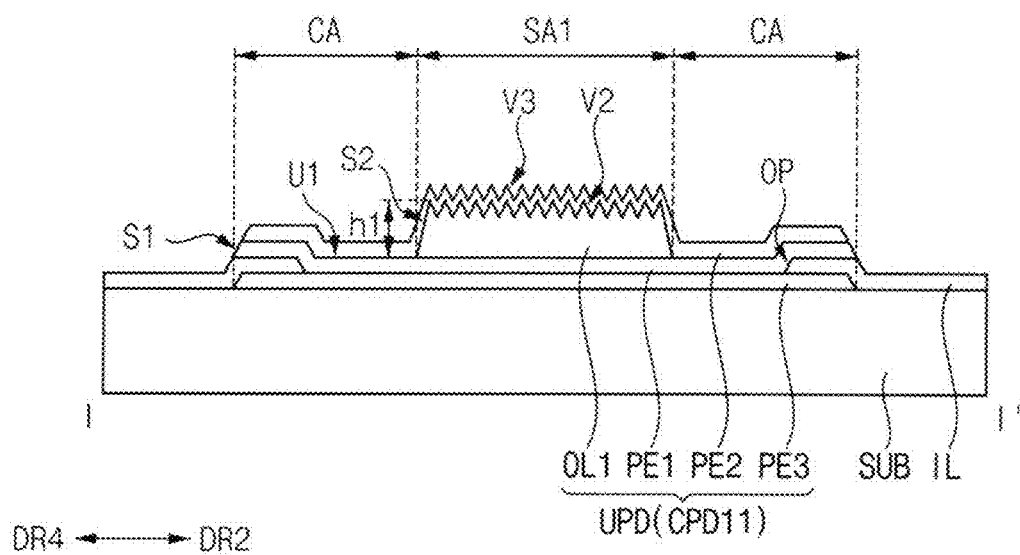
FIG. 7 is a cross-sectional view taken along line I-I' of FIG. 6.

FIG. 7 is a cross-sectional view taken along line I-I' of FIG. 6.

Referring to FIGS. 6 and 7, in the first pad area PA1, the first center pad CPD11 may include a third conductive layer PE3, a first conductive layer PE1, a second conductive layer PE2, and the first organic layer OL1.

The third conductive layer PE3 may be disposed on the substrate SUB. The third conductive layer PE3 may extend in a second direction DR2 intersecting the first direction DR1 and a fourth direction DR4 opposite to the second direction DR2 to have a predetermined length. The third conductive layer PE3 may include a conductive material. In one embodiment, for example, the third conductive layer PE3 may include a metal or an alloy.

An insulating layer IL may be disposed on the third conductive layer PE3. An opening OP exposing the third conductive layer PE3 may be defined in the insulating layer IL. The opening OP may expose an upper surface of the third conductive layer PE3. The insulating layer IL may cover a side surface of the third conductive layer PE3. The insulating layer IL may include an inorganic insulating material. In an embodiment, the inorganic insulating material may include silicon nitride, silicon oxide, and silicon oxynitride, for example. These may be used alone or in combination with each other. However, the material included in the insulating layer IL is not limited thereto, and the insulating layer IL may include at least one selected from other various insulating materials.

The first conductive layer PE1 may be disposed on the insulating layer IL. The first conductive layer PE1 may be disposed in the opening OP of the insulating layer IL. The first conductive layer PE1 may extend in the second direction DR2 and the fourth direction DR4 to have a predetermined length. The first conductive layer PE1 may cover the third conductive layer PE3 exposed through the opening OP. The first conductive layer PE1 may cover the third conductive layer PE3 and a portion of the insulating layer IL. The third conductive layer PE3 may be disposed between the substrate SUB and the first conductive layer PE1, and the third conductive layer PE3 may contact the first conductive layer PE1.

The first conductive layer PE1 may include a conductive material. In one embodiment, for example, the first conductive layer PE1 may include a metal or an alloy. The first conductive layer PE1 and the third conductive layer PE3 may be electrically connected. The first conductive layer PE1 may have an upper surface U1 and a side surface S1.

The first organic layer OL1 may be disposed on the first conductive layer PE1. The first organic layer OL1 may be disposed on the upper surface U1 of the first conductive layer PE1. The first organic layer OL1 may not be disposed on the side surface S1 of the first conductive layer PE1. The first organic layer OL1 may not have a structure extending in the second direction DR2 and the fourth direction DR4 but may have an island structure.

The first organic layer OL1 may have an upper surface V2 having an uneven shape and a side surface S2. The uneven shape may be referred to as a protrusion shape or a concave-convex shape. The first organic layer OL1 may have a predetermined thickness h1. A step difference may be defined or formed in the first center pad CPD11 by the first organic layer OL1.

The first organic layer OL1 may include an organic insulating material. In an embodiment, the organic insulating material may include polyacrylic resin and polyimide resin. These may be used alone or in combination with each other. However, the material included in the first organic layer OL1 is not limited thereto, and the first organic layer OL1 may include at least one selected from other various organic insulating materials.

The second conductive layer PE2 may be disposed on the first organic layer OL1. The second conductive layer PE2 may cover the first organic layer OL1. The second conductive layer PE2 may cover the side surface S2 of the first organic layer OL1 and the upper surface V2 of the first organic layer OL1. The second conductive layer PE2 may completely cover the first organic layer OL1. The second conductive layer PE2 may have an upper surface V3 having an uneven shape corresponding to a profile of the upper surface V2 of the first organic layer OL1.

As the upper surface V3 of the second conductive layer PE2 included on the uppermost portion of the first center pad CPD11 has the uneven shape, so that the first center pad CPD11 may also be referred to as an uneven pad UPD.

The uneven pad UPD may include the first stepped area SA1 in which the first organic layer OL1 is disposed and the connection area CA surrounding the first stepped area SA1.

In the first stepped area SA1, the first conductive layer PE1 may be spaced apart from the second conductive layer PE2. In the first stepped area SA1, the first conductive layer PE1 may not contact the second conductive layer PE2 by the first organic layer OL1. In the first stepped area SA1, the first conductive layer PE1 and the second conductive layer PE2 may not be electrically connected. In the first stepped area SA1, the first organic layer OL1 may be not penetrated. No hole may be defined in the first organic layer OL1.

In the connection area CA, the first conductive layer PE1 may contact the second conductive layer PE2. In the connection area CA, the first conductive layer PE1 and the second conductive layer PE2 may be electrically connected. In the first stepped area SA1, the first conductive layer PE1 and the second conductive layer PE2 may not contact each other through the organic layer OL1 as no contact hole is defined in the organic layer OL1.

Figure 8:
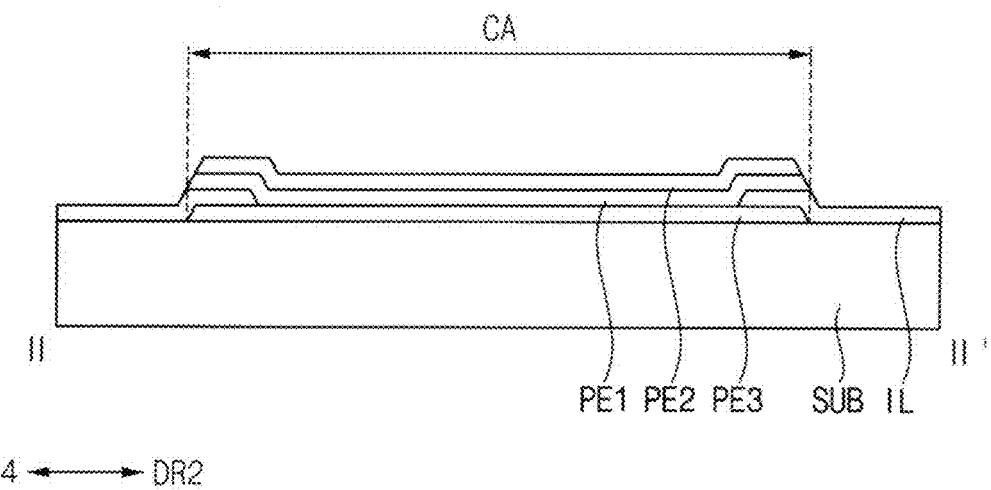
FIG. 8 is a cross-sectional view taken along line II-II' of FIG. 6.

FIG. 8 is a cross-sectional view taken along line II-IF of FIG. 6. The same reference numerals are used for the same components as in FIG. 7, and any repetitive detailed descriptions of the same components will be omitted.

Referring to FIG. 8, the first to third conductive layers PE1, PE2, and PE3 may be electrically connected to each other. The first to third conductive layers PE1, PE2, and PE3 may have flat upper surfaces.

Figure 9:
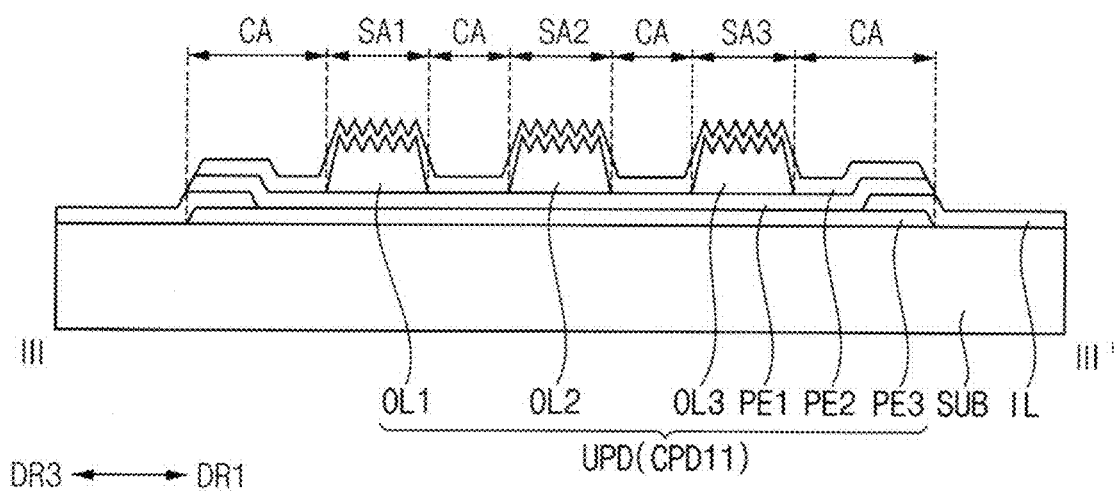
FIG. 9 is a cross-sectional view taken along line III-III' of FIG. 6.

FIG. 9 is a cross-sectional view taken along line of FIG. 6. The same reference numerals are used for the same components as in FIG. 7, and any repetitive detailed descriptions of the same components will be omitted.

Referring to FIG. 9, the uneven pad UPD may include first to third conductive layers PE1, PE2, and PE3 and first to third organic layers OL1, OL2, and OL3.

The second organic layer OL2 may be spaced apart from the first organic layer OL1 in the first direction DR1, and the third organic layer OL3 may be spaced apart from the second organic layer OL2 in the first direction DR1. Each of the first to third organic layers OL1, OL2, and OL3 may have the island structure. Each of the first to third organic layers OL1, OL2, and OL3 may have a same thickness as each other.

Referring to FIGS. 6 to 9, each of the center pads CPD1 disposed in the central portion CTP of the first pad area PA1 of the display panel DP may be the uneven pad UPD. Each of the center pads CPD1 may have a step difference equal to the thickness h1 of the first organic layer OL1, and the upper surface of each of the center pads CPD1 may have the uneven shape.

Since each of the center pads CPD1 has the step difference, pressure transmitted to the center pads CPD1 in the bonding process may increase. The step difference of each of the center pads CPD1 may be adjusted, so that the pressure transmitted to the center pads CPD1 may be adjusted. In an embodiment, the pressure transmitted to the center pads CPD1 is increased due to the step difference, such that the pressure transmitted to the center pads CPD1 may be the same as the pressure transmitted to the edge pads EPD1.

In such an embodiment, since the upper surfaces of each of the center pads CPD1 have the uneven shape, the friction coefficient of the center pads CPD1 may increase. Accordingly, in such an embodiment, the material of the center pads CPD1 and the material of the first bump BP1 corresponding to the center pads CPD1 may easily diffuse to each other by the vibration applied in the ultrasonic bonding process. As the friction coefficient of the center pads CPD1 increases, the reliability of the ultrasonic bonding process may be improved.

Figure 10:
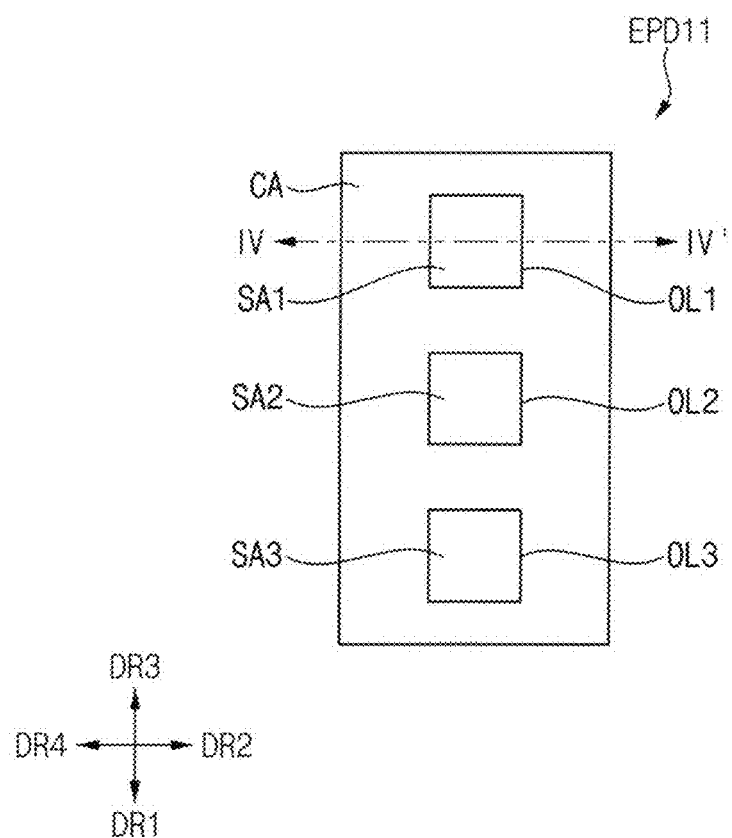
FIG. 10 is an enlarged view illustrating one pad disposed in a side portion of the display panel of FIG. 5.
Figure 11:
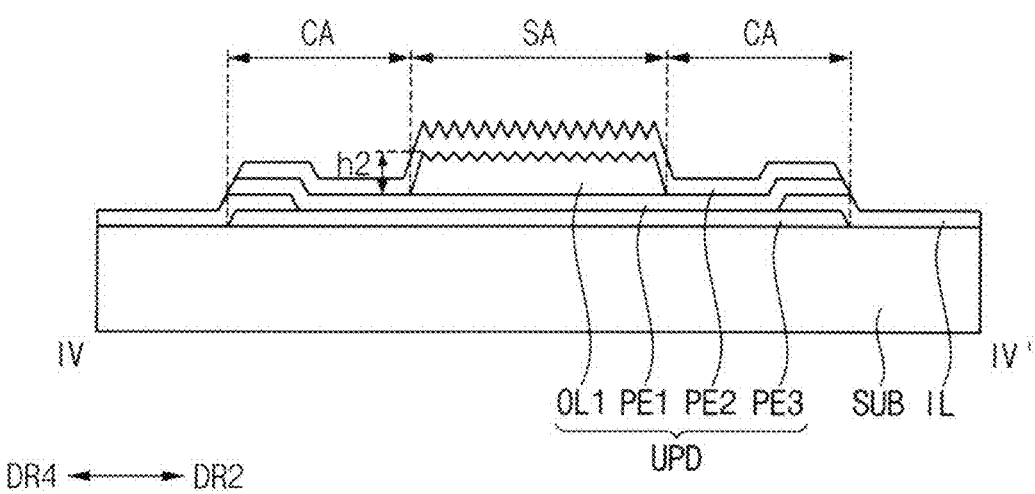
FIG. 11 is a cross-sectional view taken along line IV-IV' of FIG. 10.

FIG. 10 is an enlarged view illustrating one pad disposed in a side portion of the display panel of FIG. 5. FIG. 11 is a cross-sectional view taken along line IV-IV' of FIG. 10. Particularly, FIG. 10 may be an enlarged view illustrating the first edge pad. The same reference numerals are used for the same components as in FIGS. 6 and 7, and any repetitive detailed descriptions of the same components will be omitted.

Referring to FIGS. 10 and 11, the first edge pad EPD11 may include the third conductive layer PE3, the first conductive layer PE1, the second conductive layer PE2, and the first organic layer OL1. As the first organic layer OL1 of the first edge pad EPD11 has an upper surface having the uneven shape, the second conductive layer PE2 of the first edge pad EPD11 may have an upper surface having the uneven shape. The first edge pad EPD11 may be referred to as an uneven pad UPD. Each of the edge pads EPD1 disposed on the side portion EGP of the first pad area PA1 of the display panel DP may be the uneven pad UPD.

Each of the edge pads EPD1 may have a step difference equal to a thickness h2 of the first organic layer OL1. Since each of the edge pads EPD1 has the step difference, the pressure transmitted to the edge pads EPD1 in the bonding process may increase.

The thickness h2 of the first organic layer OL1 of the first edge pad EPD11 may be smaller than the thickness h1 of the first organic layer OL1 of the first center pad CPD11. The thickness h1 of the first organic layer OL1 of the first center pad CPD11 may be greater than the thickness h2 of the first organic layer OL1 of the first edge pad EPD11.

In such an embodiment, an increase in pressure transmitted to the center pads CPD1 may be greater than an increase in pressure transmitted to the edge pads EPD1. The pressure transmitted to the center pads CPD1 and the pressure transmitted to the edge pads EPD1 may be adjusted by adjusting the thickness of the first organic layer OL1 therein. The pressure transmitted to the center pads CPD1 may be the same as the pressure transmitted to the edge pads EPD1.

In such an embodiment, since the upper surface of each of the edge pads EPD1 has the uneven shape, the friction coefficient of the edge pads EPD1 may increase. The reliability of the ultrasonic bonding process may be improved.

Referring to FIGS. 1 to 11, in an embodiment, each of the center pads CPD1 disposed in the central portion CTP of the first pad area PA1 may be the uneven pad UPD.

In an embodiment, each of the pads disposed in the central portion of the second pad area PA2 may be the uneven pad UPD.

In an embodiment, each of the pads disposed in the central portion of the third pad area PA3 may be the uneven pad UPD.

In an embodiment, each of the center pads CPD1 disposed on the central portion CTP of the first pad area PA1 and the edge pads EPD1 disposed on the side portion EGP may be the uneven pad UPD. Each of the first pads PD1 disposed in the first pad area PA1 may be the uneven pad UPD.

In an embodiment, each of the pads disposed on the central portion of the second pad area PA2 and the pads disposed on the side portion of the second pad area PA2 may be the uneven pad UPD. Each of the second pads PD2 disposed in the second pad area PA2 may be the uneven pad UPD.

In an embodiment, each of the pads disposed on the central portion of the third pad area PA3 and the pads disposed on the side portion of the third pad area PA3 may be the uneven pad UPD. Each of the third pads PD3 disposed in the third pad area PA3 may be the uneven pad UPD.

FIGS. 12 to 17 are views illustrating an embodiment of a method of manufacturing the display device of FIG. 1.

Figure 12:
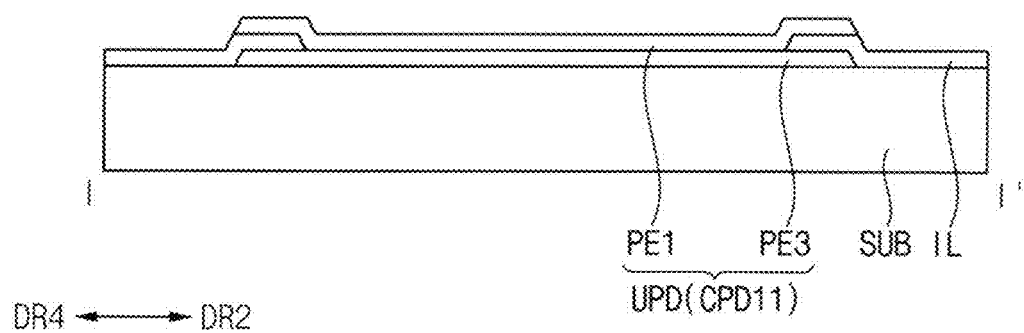
FIGS. 12 to 17 are views illustrating an embodiment of a method of manufacturing the display device of FIG. 1.

Referring to FIG. 12, in an embodiment of a method of manufacturing the display device, the substrate SUB may be provided or prepared. The third conductive layer PE3 may be provided or formed on the substrate SUB. The third conductive layer PE3 may be patterned to have the predetermined length.

The insulating layer IL may be provided or formed on the third conductive layer PE3. The insulating layer IL may be patterned to expose the upper surface of the third conductive layer PE3, and to cover the side surface of the third conductive layer PE3 and the substrate SUB.

The first conductive layer PE1 may be provided or formed on the third conductive layer PE3 and the insulating layer IL.

The first conductive layer PE1 may be patterned to cover the upper surface of the third conductive layer PE3 and a portion of the insulating layer IL.

Figure 13:
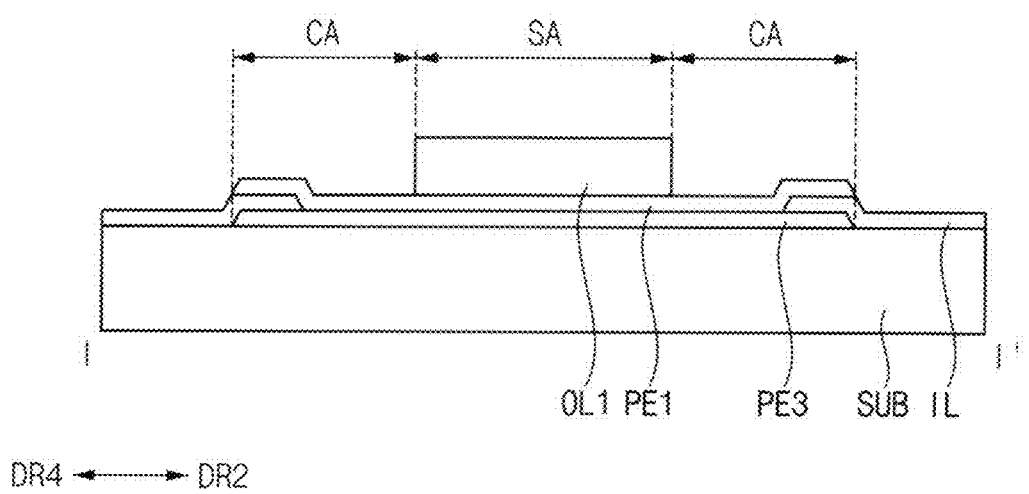

Referring to FIG. 13, the first organic layer OL1 may be provided or formed on the first conductive layer PE1. The first organic layer OL1 may be patterned and disposed on the first conductive layer PE1.

Figure 14:
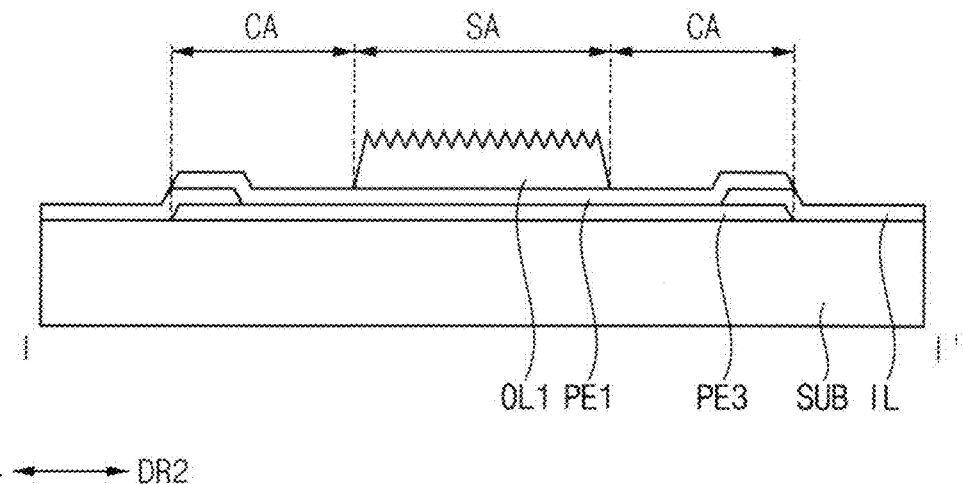

Referring to FIG. 14, the first organic layer OL1 may be dry etched. The upper surface of the first organic layer OL1 may be dry etched to have the uneven shape. The etched thickness of the upper surface of the first organic layer OL1 may be smaller than the thickness of the first organic layer OL1. No hole may be formed through the first organic layer OL1 after being dry etched.

Figure 15:
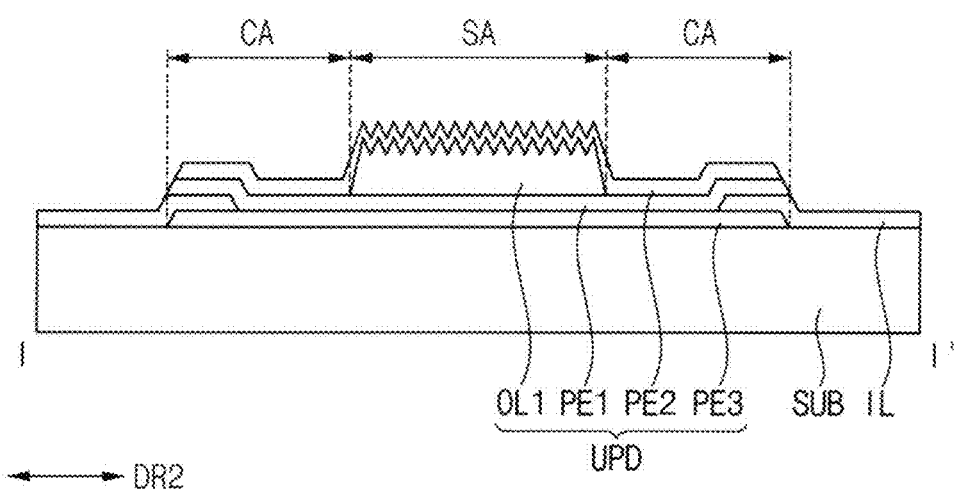

Referring to FIG. 15, the second conductive layer PE2 may be provided or formed on the first organic layer OL1. The material of the second conductive layer PE2 may be uniformly deposited. The second conductive layer PE2 may be formed along the profile of the upper surface of the first organic layer OL1. The upper surface of the second conductive layer PE2 may have the uneven shape. The second conductive layer PE2 may be patterned and disposed on the first conductive layer PE1 and the first organic layer OL1. Before the ultrasonic bonding process, the second conductive layer PE2 may have the uneven shape.

Figure 16:
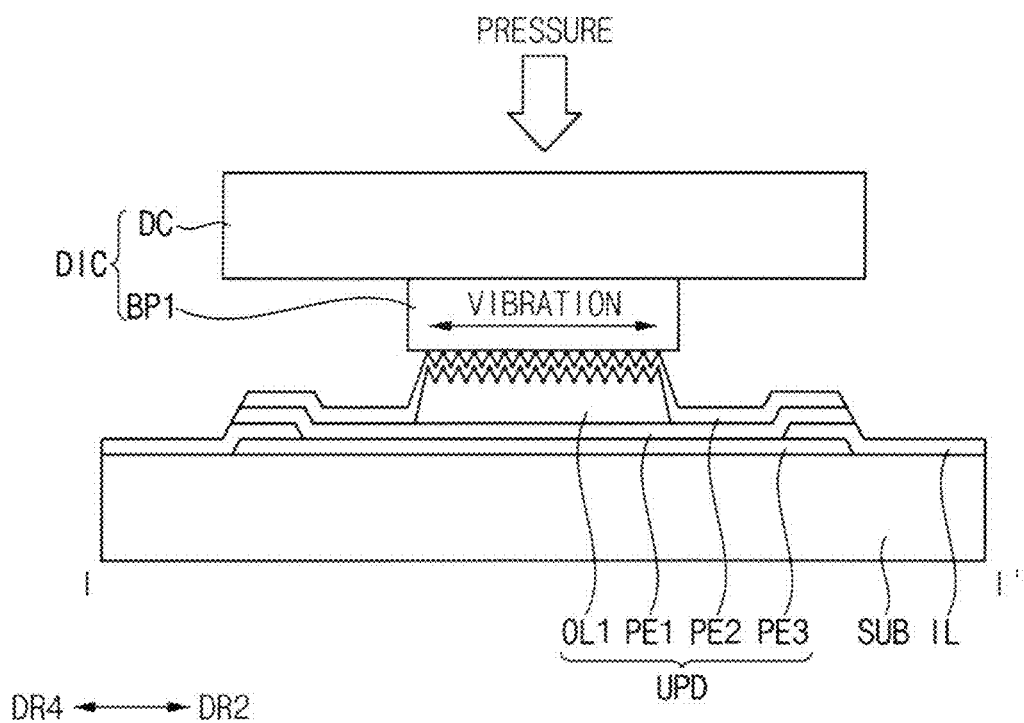

Referring to FIG. 16, the first bump BP1 of the driving chip DIC may contact the second conductive layer PE2. A pressure may be applied to the driving chip DIC from the first bump BP1 toward the second conductive layer PE2. Vibration may be applied to the second conductive layer PE2 and the first bump BP1 using ultrasonic waves. The second conductive layer PE2 and the first bump BP1 may be ultrasonically bonded to each other.

Figure 17:
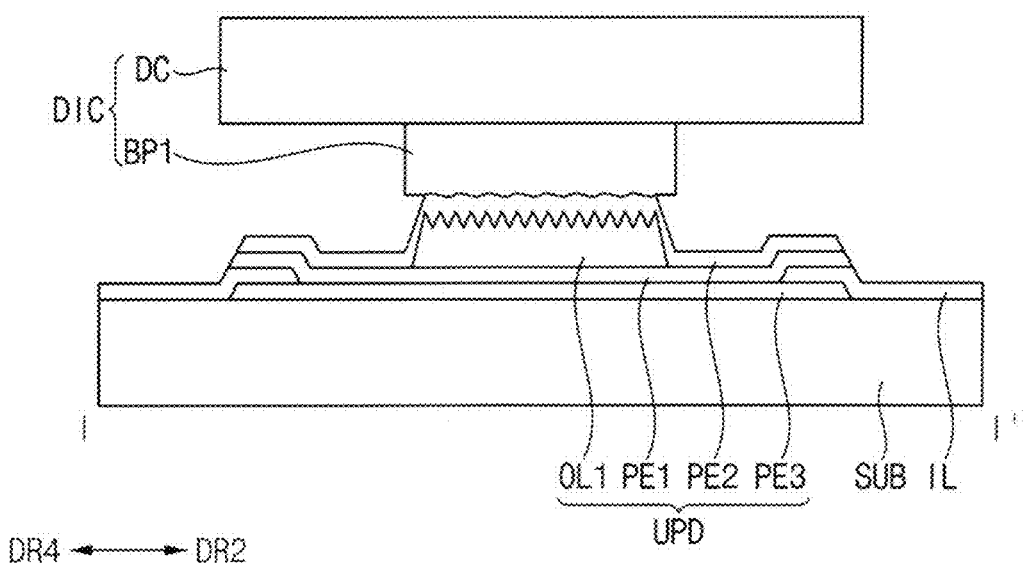

Referring to FIG. 17, the second conductive layer PE2 and the first bump BP1 may be bonded to each other. At the boundary between the second conductive layer PE2 and the first bump BP1, since the material of the second conductive layer PE2 and the material of the first bump BP1 diffuse to each other, the second conductive layer PE2 and the first bump BP1 may be electrically connected to each other.

Before the ultrasonic bonding process, the upper surface of the second conductive layer PE2 has the uneven shape, so that reliability of the ultrasonic bonding process may be improved.

Figure 18:
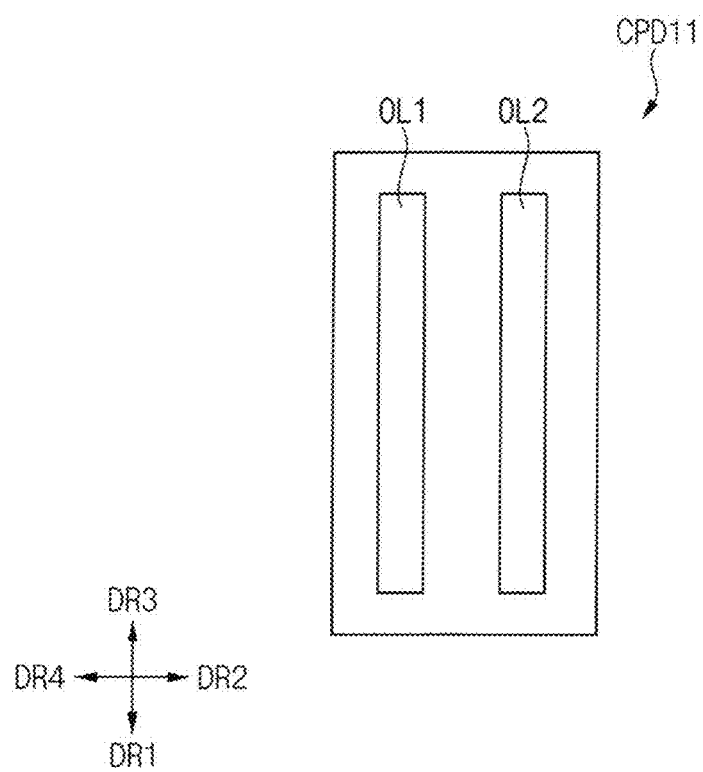
FIG. 18 is an enlarged view illustrating one pad included in a display panel of a display device according to an embodiment.

FIG. 18 is an enlarged view illustrating one pad included in a display panel of a display device according to an embodiment. Particularly, FIG. 18 may be an enlarged view illustrating a center pad corresponding to the first center pad of FIG. 6.

Referring to FIG. 18, the first center pad CPD11 may include the first organic layer OL1 and the second organic layer OL2 spaced apart from the first organic layer OL1 in the second direction DR2. The first organic layer OL1 and the second organic layer OL2 may have a predetermined length in the first direction DR1. The first organic layer OL1 and the second organic layer OL2 may have the island structure.

Figure 19:
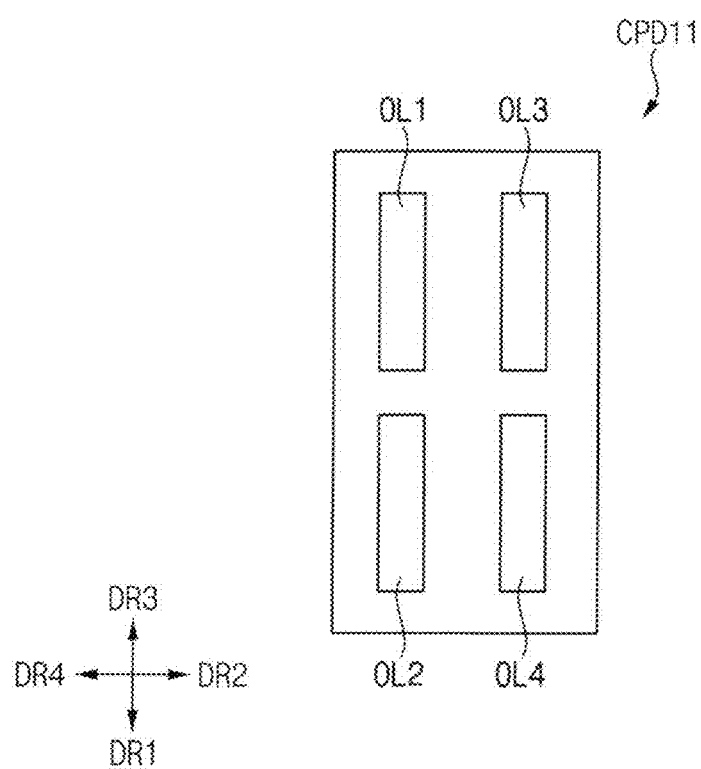
FIG. 19 is an enlarged view illustrating one pad included in a display panel of a display device according to an embodiment.

FIG. 19 is an enlarged view illustrating one pad included in a display panel of a display device according to an embodiment. Particularly, FIG. 19 may be an enlarged view illustrating a center pad corresponding to the first center pad of FIG. 6.

Referring to FIG. 19, the first center pad CPD11 may include the first organic layer OL1, the second organic layer OL2 spaced apart from the first organic layer OL1 in the first direction DR1, the third organic layer OL3 spaced apart from the first organic layer OL1 in the second direction DR2 intersecting the first direction DR1, and the fourth organic layer OL4 spaced apart from the second organic layer OL2 in the second direction DR2. The first to fourth organic layers OL1, OL2, OL3, and OL4 may have the island structure.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:
   a substrate including a display area and a pad area spaced apart from the display area; and
   an uneven pad disposed on the substrate in the pad area,
   wherein the uneven pad includes a first conductive layer, a first organic layer disposed on the first conductive layer, and a second conductive layer disposed on the first organic layer,
   the first organic layer has an island structure,
   the first organic layer has an upper surface and a side surface extending from the upper surface, and
   the upper surface of the first organic layer has an uneven shape.

2. The display panel of claim 1, wherein the second conductive layer covers the first organic layer.

3. The display panel of claim 1, wherein the second conductive layer has an upper surface having an uneven shape corresponding to the uneven shape of the upper surface of the first organic layer.

4. The display panel of claim 1, wherein
   the first organic layer is disposed on an upper surface of the first conductive layer, and
   the first organic layer is not disposed on a side surface of the first conductive layer.

5. The display panel of claim 1, wherein
   the uneven pad further includes a third conductive layer, and
   the third conductive layer is disposed between the substrate and the first conductive layer and contacts the first conductive layer.

6. The display panel of claim 1, wherein the uneven pad includes at least one selected from titanium, aluminum, and molybdenum.

7. The display panel of claim 1, wherein
   the uneven pad includes a stepped area in which the first organic layer is disposed and a connection area surrounding the stepped area, and
   the first conductive layer is spaced apart from the second conductive layer in the stepped area.

8. The display panel of claim 7, wherein the first conductive layer contacts the second conductive layer in the connection area.

9. The display panel of claim 1, wherein
   the uneven pad further includes a second organic layer, and
   the second organic layer is disposed on the first conductive layer, has an upper surface having an uneven shape, and is spaced apart from the first organic layer in a first direction.

10. The display panel of claim 9, wherein
the uneven pad further includes a third organic layer, and
the third organic layer is disposed on the first conductive layer, has an upper surface having an uneven shape, and is spaced apart from the first organic layer in a second direction intersecting the first direction.

11. The display panel of claim 1, further comprising:
a plurality of first pads disposed on a central portion of the pad area; and
a plurality of second pads disposed on a side portion of the pad area,
wherein the first pads and the second pads are disposed on the substrate in the pad area and are arranged in a matrix form.

12. The display panel of claim 11, wherein each of the first pads includes the uneven pad.

13. The display panel of claim 12, wherein each of the second pads includes the uneven pad.

14. The display panel of claim 13, wherein a thickness of a first organic layer of each of the first pads is greater than a thickness of a first organic layer of each of the second pads.

15. A display device comprising:
a substrate including display area, a first pad area spaced apart from the display area, and a second pad area spaced apart from the first pad area;
a display panel disposed on the substrate in the first pad area, wherein the display panel includes a first uneven pad including a first conductive layer, an organic layer disposed on the first conductive layer and having an upper surface having an uneven shape, and a second conductive layer disposed on the organic layer; and
a driving chip including a first bump electrically connected to the first uneven pad.

16. The display device of claim 15, wherein
the display panel further includes a second uneven pad disposed on the substrate in the second pad area and including a first conductive layer, an organic layer disposed on the first conductive layer and having an upper surface having an uneven shape, and a second conductive layer disposed on the organic layer, and
the display device further comprises a flexible substrate including a second bump electrically connected to the second uneven pad.

17. The display device of claim 16, wherein
the flexible substrate further includes a third bump spaced apart from the second bump, and
the display device further comprises a main substrate including a third uneven pad electrically connected to the third bump.

18. The display device of claim 17, wherein the third uneven pad includes a first conductive layer, an organic layer disposed on the first conductive layer and having an upper surface having an uneven shape, and a second conductive layer disposed on the organic layer.

19. The display device of claim 17, wherein the first to third bumps includes at least one selected from gold, nickel, and tin.

* * * * *